United States Patent
Fort et al.

(10) Patent No.: US 11,137,786 B2
(45) Date of Patent: Oct. 5, 2021

(54) DEVICE COMPRISING A START-UP CIRCUIT, AND METHOD OF MANUFACTURING THEREOF

(71) Applicant: STMicroelectronics (Rousset) SAS, Rousset (FR)

(72) Inventors: Jimmy Fort, Puyloubier (FR); Maud Pierrel, Bras (FR); Nicolas Borrel, Martigues (FR); Thierry Soude, Puyloubier (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 0 days.

(21) Appl. No.: 15/931,280

(22) Filed: May 13, 2020

(65) Prior Publication Data
US 2020/0371541 A1 Nov. 26, 2020

(30) Foreign Application Priority Data
May 20, 2019 (FR) ...................................... 1905244

(51) Int. Cl.
*G05F 3/26* (2006.01)
(52) U.S. Cl.
CPC .................................... *G05F 3/262* (2013.01)
(58) Field of Classification Search
None
See application file for complete search history.

(56) References Cited

U.S. PATENT DOCUMENTS

| | | | | |
|---|---|---|---|---|
| 4,812,679 A | * | 3/1989 | Mahabadi | H03K 17/223 327/143 |
| 5,528,182 A | * | 6/1996 | Yokosawa | H03K 17/223 327/143 |
| 5,959,477 A | * | 9/1999 | Chung | H03K 17/223 327/143 |
| 5,999,054 A | | 12/1999 | Suzuki | |
| 6,137,324 A | * | 10/2000 | Chung | H03K 17/223 327/143 |
| 6,181,173 B1 | * | 1/2001 | Homol | H03K 17/223 327/143 |
| 6,346,848 B1 | * | 2/2002 | Shkap | G05F 3/267 323/312 |
| 6,879,194 B1 | * | 4/2005 | Caldwell | H03K 17/223 327/143 |
| 7,893,734 B2 | * | 2/2011 | Garcia | G06F 1/24 327/143 |
| 8,519,755 B2 | * | 8/2013 | Suzuki | H03K 17/223 327/143 |
| 8,736,320 B2 | * | 5/2014 | Kawamura | H03K 3/012 327/143 |
| 2008/0106308 A1 | * | 5/2008 | Tu | H03K 17/284 327/143 |
| 2016/0134274 A1 | | 5/2016 | Takemura | |
| 2016/0191041 A1 | | 6/2016 | Chung | |
| 2018/0123583 A1 | | 5/2018 | Singh et al. | |

\* cited by examiner

*Primary Examiner* — Jeffery S Zweizig
(74) *Attorney, Agent, or Firm* — Slater Matsil, LLP

(57) ABSTRACT

An electronic device includes a starting circuit configured to compare a value representative of the power supply voltage with a threshold, wherein the circuit includes a generator of a current proportional to temperature.

22 Claims, 2 Drawing Sheets

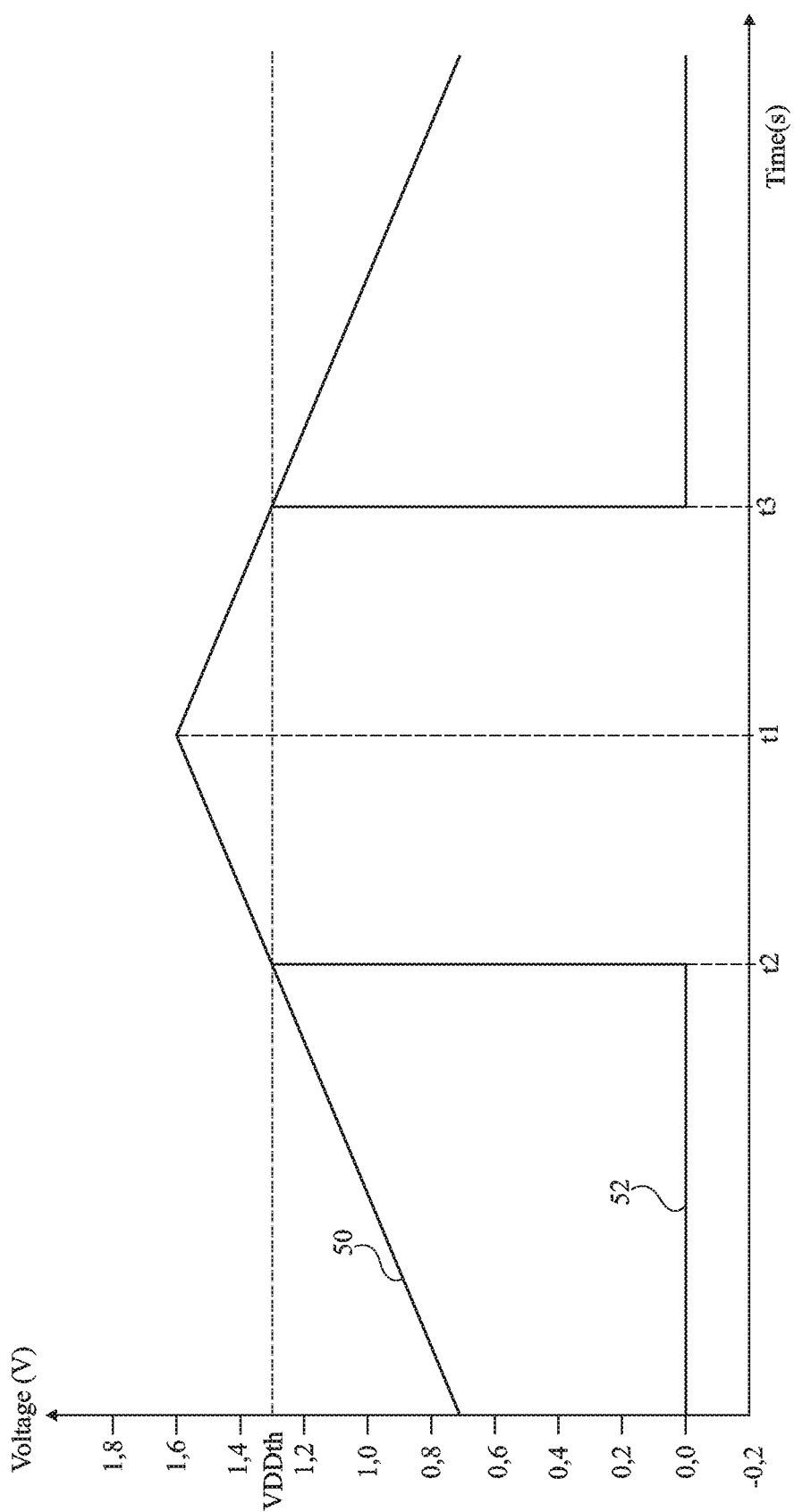

DEVICE COMPRISING A START-UP CIRCUIT, AND METHOD OF MANUFACTURING THEREOF

CROSS-REFERENCE TO RELATED APPLICATIONS

This application claims the priority benefit of French patent application number 1905244, filed on May 20, 2019, the content of which is hereby incorporated herein by reference in its entirety to the maximum extent allowable by law.

TECHNICAL FIELD

The present disclosure generally concerns electronic devices and more particularly electronic devices comprising starting circuits.

BACKGROUND

Each electronic device is generally powered with a power supply voltage VDD. The power supply voltage, noted VDD, of an electronic device is selected for example according to the components of the device and according to the provided use thereof. For example, the operating value of voltage VDD, that is, the minimum voltage enabling the electronic device to operate, may be greater than or equal to 1 V, for example, equal to 5 V.

At the starting of the device, the value of power supply voltage VDD increases up to the operating value, for example, greater than or equal to 1 V.

To ensure the operation of the components of the electronic device, the value of the power supply voltage should be sufficiently close to the operating value before starting the rest of the components of the electronic device.

The electronic device comprises a circuit configured to compare a value representative of the power supply voltage at a threshold value.

SUMMARY

An embodiment overcomes all or part of the disadvantages of devices comprising known starting circuits.

An embodiment provides an electronic device comprising a starting circuit configured to compare a value representative of the power supply voltage with a threshold, the circuit comprising a generator of a current proportional to temperature.

According to an embodiment, the transistors of the generator are MOS transistors.

According to an embodiment, the threshold value is the value of a current generated by the generator of a current proportional to temperature.

According to an embodiment, first two transistors of the circuit, assembled as a current mirror, copy at their drain the current generated by the generator.

According to an embodiment, the generator comprises two second transistors assembled as a current mirror.

According to an embodiment, the first and second current-mirror assembled transistors are coupled, by their source, to a node of application of the power supply voltage.

According to an embodiment, the current generated by the generator is the drain current of one of the second transistors.

According to an embodiment, a third transistor of the generator is in a source degeneration configuration.

According to an embodiment, the value representative of the power supply voltage is the drain current of a fourth transistor of the circuit in source degeneration configuration.

According to an embodiment, the gate of the fourth transistor is coupled to the junction point of two resistors series-coupled between a node of application of the power supply voltage and a node of application of a reference voltage.

According to an embodiment, the drain of the fourth transistor is coupled to the drain of one of the first transistors at a first node.

According to an embodiment, the first node is coupled to the gate of a fifth transistor, the fifth transistor being coupled, by its source, to the node of application of the reference voltage and, by its drain, to the drain of one of the first transistors.

An embodiment provides a method of manufacturing an electronic device comprising a starting circuit configured to compare a value representative of the power supply voltage with a threshold, the circuit comprising a generator of a current proportional to temperature, wherein source degeneration resistance values are selected to compensate for the influence of temperature variations on the threshold value.

The foregoing and other features and advantages will be discussed in detail in the following non-limiting description of specific embodiments in connection with the accompanying drawings.

BRIEF DESCRIPTION OF THE DRAWINGS

FIG. 2 shows the behavior of two voltages of the starting circuit.

DETAILED DESCRIPTION OF ILLUSTRATIVE EMBODIMENTS

Figure 1:
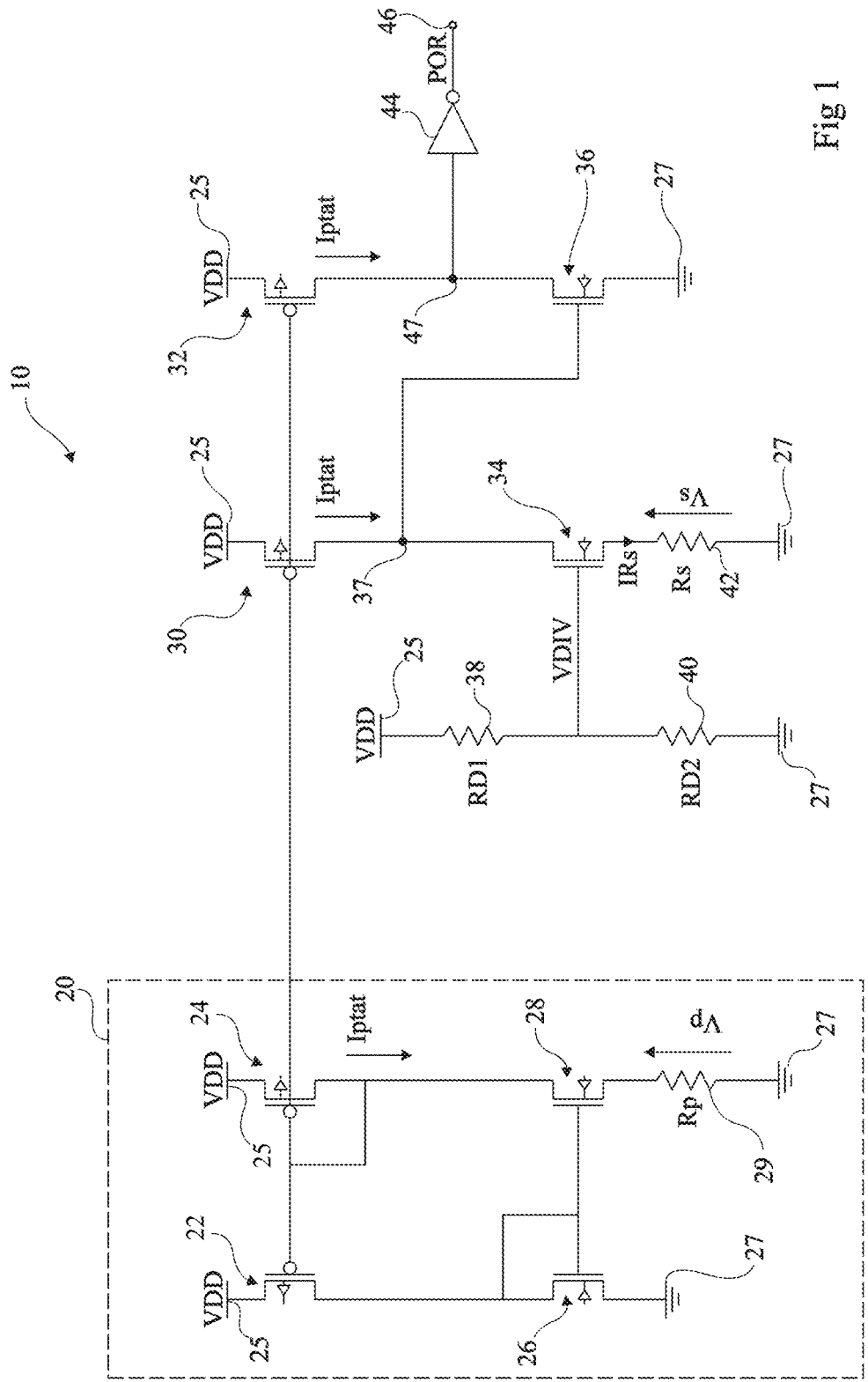
FIG. 1 shows an embodiment of a starting circuit.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed. In particular, the components of the electronic device powered with the power supply voltage are not detailed. Similarly, the circuit for generating power supply voltage VDD is not detailed. The described embodiments are adapted to all known electronic device types.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more other elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings.

The terms "about", "approximately", "substantially", and "in the order of" are used herein to designate a tolerance of plus or minus 10%, preferably of plus or minus 5%, of the value in question.

FIG. 1 shows an embodiment of a starting circuit 10 of an electronic device configured to compare a value representative of a power supply voltage VDD with a value representative of an operating threshold value VDDth. The operating threshold value VDDth, that is, the minimum value enabling the device to operate, is for example, substantially equal to 1.2 V.

The electronic device is configured so that at least part of the other components of the electronic device only operates when the value of power supply voltage VDD is greater than voltage threshold VDDth, for example, at the start. During the operation of the device, if power supply voltage VDD decreases to be smaller than voltage threshold VDDth, the device is configured to stop the operation of at least part of the components of the device, preferably, all the components of the electronic device except for the starting circuit.

Starting circuit 10 is thus preferably always in operation, and continuously compares power supply voltage VDD with threshold voltage VDDth.

Circuit 10 comprises a generator 20 of a current proportional to absolute temperature or PTAT current generator.

Generator 20 comprises two transistors 22 and 24 assembled as a current mirror. Transistors 22 and 24 are preferably MOS transistors, preferably P-channel MOS transistors. Transistors 22 and 24 are identical to within manufacturing dispersions. In particular, transistors 22 and 24 have substantially the same size, and more particularly have the same surface area. More generally, transistors 22 and 24 have substantially the same dimensions.

The sources of transistors 22 and 24 are coupled, preferably connected, to a node 25 of application of power supply voltage VDD. Further, the gates of transistors 22 and 24 are coupled, preferably connected, to each other. The gate of transistor 24 is further connected to the drain of transistor 24.

The current of the drain of transistor 22 is substantially equal to the current of the drain of transistor 24. The currents of the drains of transistors 22 and 24 correspond to current Iptat, representative of the voltage threshold VDDth with which power supply voltage VDD is desired to be compared.

The drain of each transistor 22 or 24 is coupled, preferably connected, to the drain of a transistor 26 or 28. Transistors 26 and 28 are for example MOS transistors, preferably N-channel MOS transistors.

In particular, the drain of transistor 22 is coupled, preferably connected, to the drain of transistor 26 and the drain of transistor 24 is coupled, preferably connected, to the drain of transistor 28. The gate of transistor 26 is coupled to the drain of transistor 26. The source of transistor 26 is coupled, preferably connected, to a node 27 of application of a reference voltage, preferably the ground. The gate of transistor 26 is coupled, preferably connected, to the gate of transistor 28.

The voltage between the gate and the source of transistor 26 is smaller than the threshold voltage of transistor 26. The behavior of transistor 26 is similar to the behavior of a bipolar transistor.

The source of transistor 28 is coupled to node 27 of application of the reference voltage, for example, the ground, by a resistor 29 of value Rp. Resistor 29 is a degeneration resistor. Transistor 28 is thus in source degeneration configuration. The voltage across resistor 29 is noted Vp.

In operation, transistor 26 is in a low-inversion mode rather than in a saturation mode, the voltage between the gate and the source of transistor 28 is thus smaller than the threshold voltage of transistor 28.

The size of transistor 28 is substantially n times greater than the size of transistor 26, that is, the surface area of transistor 28 is n times greater than the surface area of transistor 26, n being an integer greater than or equal to 2, for example, equal to 8.

The value of current Iptat is approximately obtained by the following formula:

$$Iptat \approx \frac{k*T}{q} * \frac{\ln(n)}{Rp} \qquad \text{[Math 1]}$$

where k is Boltzmann's constant (k≈1.38064852. 10^(−23) J.K^(−1), ^ representing the power function), T is the temperature in Kelvin (K), and q is the electric charge of an electron (q=1.602176634.10^(−19) C).

Thus, the value of current Iptat depends on temperature and temperature variations cause variations of current Iptat, representative of the threshold. The value of current Iptat is independent from the value of power supply voltage VDD. Indeed, values k, q, n, and Rp are constants.

The value of current Iptat, that is, the value representative of threshold VDDth, may be selected, to within temperature variations, by selecting the value of Rp and the value of n.

Circuit 10 further comprises two transistors 30 and 32 assembled as a current mirror to each other and to transistors 22 and 24. Transistors 30 and 32 are identical, to within manufacturing dispersions, to transistors 22 and 24. Transistors 30 and 32 are thus for example P-channel MOS transistors. The gates of transistors 30 and 32 are connected together and are connected to the gates of transistors 22 and 24. Further, the sources of transistors 30 and 32 are coupled, preferably connected, to node 25 of application of power supply voltage VDD. The drain current of transistors 30 and 32 thus is current Iptat.

The drain of transistor 30 is coupled, preferably connected, to the drain of a transistor 34. The drain of transistor 32 is coupled, preferably connected, to the drain of a transistor 36. Transistors 34 and 36 are preferably MOS transistors, preferably N-channel MOS transistors. In operation, transistor 34 is in saturation mode.

The gate of transistor 34 is coupled, preferably connected, to the junction point of a voltage dividing bridge. More particularly, the gate of transistor 34 is coupled to node 25 of application of power supply voltage VDD via a resistor 38 of value RD1. The gate of transistor 34 is also coupled to node 27 of application of the reference voltage, for example, the ground, via a resistor 40 of value RD2. The gate of transistor 34 is thus coupled to the junction points of the two resistors 38 and 40 series-coupled between node 25 and node 27.

The source of transistor 34 is coupled to node 27 of application of the reference voltage, for example, the ground, via a resistor 42 of value Rs. Resistor 42 thus is a degeneration resistor. Transistor 34 is thus in a source degeneration configuration. The voltage across resistor 42 is noted Vs. The current flowing through resistor 42 is noted IRs, its value being obtained by the following formula:

$$IRs = \frac{Vs}{Rs} \qquad \text{[Math 2]}$$

The value of current IRs may also be obtained with the following formula:

$$IRs = \frac{S}{2} * (VDIV - Vs - Vt34)^2 \quad [\text{Math 3}]$$

where S is the transconductance parameter of transistor 34, VDIV is the voltage at the gate of transistor 34, and Vt34 is the threshold voltage of transistor 34.

The value of VDIV depends on the value of resistors 38 (RM.) and 40 (RD2) as well as on the value of power supply voltage VDD, according to the following formula:

$$VDIV = VDD * \frac{RD1}{RD1 + RD2} \quad [\text{Math 4}]$$

The source of transistor 36 is coupled, preferably connected, to node 27 of application of the reference voltage, for example, the ground. The gate of transistor 36 is coupled, preferably connected, to a node 37. Node 37 is coupled, preferably connected, to the drain of transistor 30 and to the drain of transistor 34.

The circuit comprises in the example of FIG. 1 an inverter 44 coupled between an output node 46 and a coupling node 47. Coupling node 47 is coupled, preferably connected, to the drain of transistor 32 and to the drain of transistor 36.

An output signal POR, obtained on node 46, takes a high value when the value of current IRs, representative of voltage threshold value VDDth, is greater than the value of current Iptat, representative of the value of power supply voltage VDD. Signal POR takes a low value when the value of current IRs, representative of voltage threshold value VDDth, is smaller than the value of current Iptat, representative of the value of power supply voltage VDD.

Output node 46 is coupled to components of the starting circuit enabling or not to power the components of the electronic device.

As a variation, it is possible for circuit 10 not to comprise inverter 44. Output node 46 then is node 47. In this case, output signal POR takes the low value when the value of current IRs, representative of voltage threshold value VDDth, is greater than the value of current Iptat, representative of the value of power supply voltage VDD. Output signal POR takes the high value when the value of current IRs, representative of voltage threshold value VDDth, is smaller than the value of current Iptat, representative of the value of power supply voltage VDD.

Generator 20 generates current Iptat, representative of voltage threshold value VDDth. Transistors 22, 24, 30, and 32 being assembled as a current mirror, the currents at their drains are the same. Thus, the drain current of transistor 30 is current Iptat. Further, the drain current of transistor 34 is current IRs.

When the value of current IRs is smaller than the value of current Iptat, the circuit is in a situation when the value of power supply voltage VDD is smaller than the value of voltage threshold VDDth. The current at the level of node 37 thus is current Iptat. Thus, the value of the voltage on node 47 is a low value, for example substantially corresponding to the value of the voltage at node 27, that is, for example, 0 V when node 27 is the ground. The components of the electronic device are then not powered.

When the value of current IRs is greater than the value of current Iptat, the circuit is in a situation where the value of power supply voltage VDD is greater than voltage threshold value VDDth. The current at the level of node 37 thus is current IRs. Thus, the value of the voltage on node 47 is a high value, for example substantially corresponding to the value of the voltage at node 25, that is, power supply voltage VDD. The value of the voltage on node 47 can thus vary when power supply voltage VDD varies. The components of the electronic device are then powered and in operation.

The circuit passes from one situation to the other when the value of current IRs is equal to the value of current Iptat, and thus when the value of power supply voltage VDD is equal to the value of threshold VDDth. This case corresponds to the following formulas:

$$Iptat = IRs = \frac{k*T}{q} * \frac{\ln(n)}{Rp} = \frac{Vs}{Rs} \quad [\text{Math 5}]$$

$$VDIV = VDDth * \frac{RD1}{RD1 + RD2} \quad [\text{Math 6}]$$

$$\frac{S}{2} * (VDIV - Vs - Vt34)^2 = \frac{Vs}{Rs} \quad [\text{Math 7}]$$

where k is Boltzmann's constant (k≈1.38064852. 10^(−23) J.K^(−1), ^ representing the power function), T is the temperature in Kelvin (K), q is the electric charge of an electron (q=1.602176634.10^(−19) C), n is the surface area ratio between transistors 26 and 28, Rp is the value of resistor 29, Rs is the value of resistor 42, Vs is the voltage across resistor 42, RD1 is the value of resistor 38, RD2 is the value of resistor 40, S is the transconductance parameter of transistor 34, Vt34 is the value of the threshold voltage of transistor 34.

These formulas provide an approximate formula of the threshold voltage value VDDth:

$$VDDth = \frac{RD1 + RD2}{RD2} * \left( \frac{k*T}{q} * \ln(n) * \frac{Rs}{Rp} + Vt34 \right) \quad [\text{Math 8}]$$

where RD1, RD2, k, q, ln(n), Rs, and Rp are previously-defined constants, T and Vt34 are previously-described variables.

The value of voltage threshold VDDth can thus vary along with temperature. Indeed, voltage threshold value VDDth depends on temperature T and on threshold voltage value Vt34, and the value of threshold voltage Vt34 depends on temperature. More particularly, the value of threshold voltage Vt34 increases when temperature T decreases.

The values of resistances Rs and Rp as well as value n are selected on manufacturing of the electronic device to compensate for the variations of threshold voltage Vt34 according to temperature with the variations of k*T*ln(n)*Rs/(q*Rp). The values of resistors RD1, RD2, and Rp and value n are selected to select the value of voltage threshold VDDth.

FIG. 2 shows the behavior of two voltages of the starting circuit. More particularly, FIG. 2 comprises a curve 50 showing the behavior of power supply voltage VDD and a curve 52 showing the behavior of the voltage on node 47.

The ordinate of FIG. 2 is the voltage in volts (V). The abscissa of FIG. 2 is time in seconds (s).

In the period shown in FIG. 2, power supply voltage VDD increases from a value substantially equal to 0.7 V, at the origin of the curve, up to a value substantially equal to 1.6 V, at a time t1. Power supply voltage VDD then decreases to be substantially equal to 0.7 V again.

The value of voltage threshold VDDth is, in this example, substantially equal to 1.3 V.

Until a time t2, voltage VDD is smaller than voltage threshold VDDth. Thus, the voltage on node 47 is substantially equal to the low value, here, substantially equal to 0 V.

Between time t2 and a time t3, subsequent to time t1, power supply voltage VDD is greater than the value of voltage threshold VDDth. The voltage on node 47 is equal to the value of power supply voltage VDD. Thus, the value of the voltage on node 47 increases, between times t2 and t1, from 1.3 V to 1.6 V and decreases, between times t1 and t3, from 1.6 V to 1.3 V.

From time t3, power supply voltage VDD is smaller than voltage threshold VDDth. Thus, the voltage on node 47 is substantially equal to the low value, here, substantially equal to 0 V.

Before time t2 and after time t3, at least part of the components of the electronic device are not powered and are thus not operating, preferably all the components other than the starting circuit.

Between times t2 and t3, at least part of the components of the electronic device are powered and may thus be operating, preferably all the components other than the starting circuit.

It could have been chosen to form a starting circuit configured to compare the value of the power supply voltage with a voltage threshold value comprising a reference bandgap circuit using bipolar transistors. However, such a circuit would require a surface area greater than that used by the described embodiments of circuits.

An advantage of the described embodiments is that it is possible to at least partially compensate for the influence of temperature variations on the value of voltage threshold VDDth. The value of voltage threshold VDDth is thus more accurate.

Another advantage of the embodiments described herein is that they consume little power. They are thus adapted to any types of electronic devices, including low power consumption electronic devices.

Further, the described embodiments comprise few components. The surface area used by the circuits is thus relatively small. In particular, a preferred embodiment of the starting circuit comprises MOS transistors rather than bipolar transistors, which use more surface area.

Various embodiments and variations have been described. It will be understood by those skilled in the art that certain features of these various embodiments and variations may be combined, and other variations will occur to those skilled in the art.

Finally, the practical implementation of the described embodiments and variations is within the abilities of those skilled in the art based on the functional indications given hereinabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An electronic device comprising:
   a starting circuit configured to compare a value representative of a power supply voltage with a threshold, the starting circuit comprising:
   a current generator configured to generate a current proportional to temperature; and
   a source degeneration transistor in a source degeneration configuration and comprising a gate coupled to a junction point of two resistors series-coupled between a node at the power supply voltage and a node at a reference voltage;
   wherein the value representative of the power supply voltage is a drain current of the source degeneration transistor.

2. The device of claim 1, wherein a value of the threshold is a value of the current generated by the current generator.

3. The device of claim 2, wherein the starting circuit comprises two first transistors assembled as a first current mirror and configured to copy at their respective drains the current generated by the current generator.

4. The device of claim 2, wherein the current generator comprises two second transistors assembled as a current mirror.

5. The device of claim 3, wherein the current generator comprises two second transistors assembled as a second current mirror, and wherein the first and second current mirrors are coupled, by their respective sources, to the node at the power supply voltage.

6. The device of claim 4, wherein the current generated by the current generator is a drain current of one of the second transistors.

7. The device of claim 1, wherein a third transistor of the current generator is in the source degeneration configuration.

8. The device of claim 1, wherein two first transistors of the starting circuit, assembled as a current mirror, copy at their respective drains the current generated by the current generator, and wherein a drain of the source degeneration transistor is coupled to a drain of one of the first transistors at a first node.

9. The device of claim 8, wherein the first node is coupled to a gate of a fifth transistor, and wherein the fifth transistor is coupled, by its source, to the node at the reference voltage, and, by its drain, to the drain of one of the first transistors.

10. The device of claim 1, wherein transistors of the current generator are metal-oxide-semiconductor (MOS) transistors.

11. A method of manufacturing an electronic device comprising:
    forming a starting circuit configured to compare a value representative of a power supply voltage with a threshold, the forming the starting circuit comprising:
    forming a current generator configured to generate a current proportional to temperature; and
    using a source degeneration transistor in a source degeneration configuration,
    the source degeneration transistor comprising a gate coupled to a junction point of two resistors series-coupled between a node at the power supply voltage and a node at a reference voltage, and
    the value representative of the power supply voltage being a drain current of the source degeneration transistor; and
    selecting source degeneration resistance values to compensate for an influence of temperature variations on a value of the threshold.

12. The method of claim 11, further comprising setting the value of the threshold to be a value of the current generated by the current generator.

13. The method of claim 12, wherein forming the starting circuit comprises assembling two first transistors as a first current mirror configured to copy at their respective drains the current generated by the current generator.

14. The method of claim 12, wherein forming the current generator comprises assembling two second transistors as a current mirror.

15. The method of claim 13, wherein forming the current generator comprises assembling two second transistors as a second current mirror, the method further comprising coupling the first and second current mirrors, by their respective sources, to a node at the power supply voltage.

16. The method of claim 14, wherein the current generated by the current generator is a drain current of one of the second transistors.

17. The method of claim 11, wherein forming the current generator comprises using a third transistor in a source degeneration configuration.

18. The method of claim 11, wherein forming the current generator comprises using all metal-oxide-semiconductor (MOS) transistors.

19. An electronic device comprising:
a starting circuit configured to compare a value representative of a power supply voltage with a threshold, the starting circuit comprising:
two first transistors assembled as a current mirror;
a current generator configured to generate a current proportional to temperature; and
a source degeneration transistor in a source degeneration configuration and comprising a drain coupled to a drain of one of the first transistors at a first node;
wherein the two first transistors are configured to copy at their respective drains the current generated by the current generator; and
wherein the value representative of the power supply voltage is the drain current of the source degeneration transistor.

20. The device of claim 19, wherein transistors of the current generator are metal-oxide-semiconductor (MOS) transistors.

21. The device of claim 19, wherein a value of the threshold is a value of the current generated by the current generator.

22. The device of claim 19, wherein the first node is coupled to a gate of a fifth transistor, and wherein the fifth transistor is coupled, by its source, to a node at a reference voltage, and, by its drain, to the drain of one of the first transistors.

* * * * *